US010454492B1

(12) United States Patent
Shikata et al.

(10) Patent No.: US 10,454,492 B1
(45) Date of Patent: Oct. 22, 2019

(54) ANALOG-TO-DIGITAL CONVERTER SPEED CALIBRATION TECHNIQUES

(71) Applicant: Analog Devices, inc., Norwood, MA (US)

(72) Inventors: Akira Shikata, Everett, MA (US); Junhua Shen, Wilmington, MA (US); Anping Liu, Acton, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/012,576

(22) Filed: Jun. 19, 2018

(51) Int. Cl.
| | |
|---|---|
| H03M 1/38 | (2006.01) |
| H03M 1/46 | (2006.01) |
| H03M 1/10 | (2006.01) |
| H03M 1/06 | (2006.01) |

(52) U.S. Cl.
CPC ......... *H03M 1/466* (2013.01); *H03M 1/0612* (2013.01); *H03M 1/1033* (2013.01)

(58) Field of Classification Search
CPC .. H03M 1/466; H03M 1/0612; H03M 1/1033; H03M 1/12; H03M 1/00
USPC ........................................ 341/155, 120, 161
See application file for complete search history.

(56) References Cited

U.S. PATENT DOCUMENTS

| | | | | |
|---|---|---|---|---|
| 5,621,409 A * | 4/1997 | Cotter | ................... | H03M 1/069 |
| | | | | 341/122 |
| 8,134,487 B2 * | 3/2012 | Harpe | ................... | H03M 1/125 |
| | | | | 341/155 |
| 8,344,925 B1 | 1/2013 | Evans | | |
| 8,362,940 B2 | 1/2013 | Yoshioka | | |
| 8,456,340 B2 * | 6/2013 | Kapusta | ................ | H03M 1/125 |
| | | | | 341/144 |
| 8,786,483 B1 * | 7/2014 | Thompson | .......... | H03M 1/0836 |
| | | | | 341/120 |

(Continued)

FOREIGN PATENT DOCUMENTS

| | | |
|---|---|---|
| CN | 203554418 | 4/2014 |
| CN | 104796148 | 11/2017 |
| EP | 2779463 A3 | 12/2014 |

OTHER PUBLICATIONS

Li, Dale, "Design Challenges and Improvement Techniques for SAR ADC Driver Circuit", Texas Instruments Application Report, SLAA571A, (Nov. 2012), 15 pages.

(Continued)

*Primary Examiner* — Jean B Jeanglaude
(74) *Attorney, Agent, or Firm* — Schwegman Lundberg & Woessner, P.A.

(57) ABSTRACT

A conversion time and an acquisition time of an ADC can be estimated so that a speed of the ADC can be calibrated. An ADC circuit can perform M bit-trials in its conversion phase and continue performing additional bit-trials in a calibration mode. The ADC can count the number of additional bit-trials performed, e.g., X bit-trials, that occur before the next conversion phase, where additional bit-trials can be considered to be the number of available bit-trials during an acquisition time if the ADC continues performing bit-trials instead of sampling an input signal. The ADC can estimate the conversion time and the acquisition time using M and X. Then, the conversion time of the ADC can be calibrated by adjusting one or more of the comparison time, DAC settling delay, and logic propagation delay.

20 Claims, 6 Drawing Sheets

(56) References Cited

U.S. PATENT DOCUMENTS

| | | | |
|---|---|---|---|
| 8,793,957 B2 | 8/2014 | Wennberg | |
| 8,896,476 B2 * | 11/2014 | Harpe | H03M 1/0697 |
| | | | 341/118 |
| 9,379,726 B1 | 6/2016 | Wang et al. | |
| 9,509,329 B2 | 11/2016 | Baek et al. | |
| 9,641,189 B2 | 5/2017 | Maddox et al. | |
| 9,819,314 B1 * | 11/2017 | Chiu | H03F 3/45188 |
| 9,871,529 B1 | 1/2018 | Chong et al. | |
| 2009/0073018 A1 | 3/2009 | Mitikiri | |
| 2012/0213531 A1 | 8/2012 | Nazarathy et al. | |
| 2013/0162454 A1 | 6/2013 | Lin | |
| 2016/0373124 A1 * | 12/2016 | Kijima | H03M 1/38 |
| 2017/0250702 A1 | 8/2017 | Venca et al. | |

OTHER PUBLICATIONS

Xu, Benwei, "Calibration Techniques for High Speed Time-interleaved SAR ADC", Doctorate of Philosophy in Electrical Engineering Dissertation, The University of Texas at Dallas, 2017, (Aug. 2017), 88 pages.

Zhu, Xiaolei, "High Performance SAR A/D Converter with Calibration Techniques", Doctor of Philosophy in Engineering Thesis, Keio University, 2012, (Sep. 2012), 121 pages.

\* cited by examiner

US 10,454,492 B1

ANALOG-TO-DIGITAL CONVERTER SPEED CALIBRATION TECHNIQUES

FIELD OF THE DISCLOSURE

This document pertains generally, but not by way of limitation, to integrated circuits, and more particularly, to analog to digital converter circuits and systems.

BACKGROUND

In many electronics applications, an analog input signal is converted to a digital output signal (e.g., for further digital signal processing). For instance, in measurement systems, electronics are provided with one or more sensors to make measurements, and these sensors can generate an analog signal. The analog signal can then be provided to an analog-to-digital converter (ADC) circuit as input to generate a digital output signal for further processing. In another instance, in a mobile device receiver, an antenna can generate an analog signal based on the electromagnetic waves carrying information/signals in the air. The analog signal generated by the antenna can then be provided as input to an ADC to generate a digital output signal for further processing.

SUMMARY OF THE DISCLOSURE

This disclosure describes techniques to calibrate a conversion time of an analog-to-digital converter (ADC) circuit. A conversion time and an acquisition time of an ADC can be estimated so that a speed of the ADC can be calibrated. An ADC circuit can perform M bit-trials in its conversion phase and continue performing additional bit-trials in a calibration mode. The ADC can count the number of additional bit-trials performed, e.g., X bit-trials, that occur before the next conversion phase, where additional bit-trials can be considered to be the number of available bit-trials during an acquisition time if the ADC continues performing bit-trials instead of sampling an input signal. The ADC can estimate the conversion time and the acquisition time using M and X. Then, the conversion time of the ADC can be calibrated by adjusting one or more of the comparison time, DAC settling delay, and logic propagation delay.

In some aspects, this disclosure is directed to a method of calibrating a conversion speed of an asynchronous analog-to-digital converter (ADC) circuit. The method comprises at a time other than during an operational mode of the ADC circuit: performing a number of bit-trials of a conversion on a received analog signal; performing and counting a number of additional bit-trials; estimating a conversion time and an acquisition time using the number of bit-trials and the number of the additional bit-trials; and adjusting an operational mode conversion time by adjusting bit-trial delays based on the estimated conversion time and the estimated acquisition time.

In some aspects, this disclosure is directed to an asynchronous analog-to-digital converter (ADC) circuit for calibrating a conversion speed. The circuit comprises a digital-to-analog converter (DAC) circuit configured to sample an analog signal; and control circuitry configured to: at a time other than during an operational mode of the ADC circuit: perform a number of bit-trials of a conversion on the sampled analog signal; perform and count a number of additional bit-trials; estimate a conversion time and an acquisition time using the number of bit-trials and the number of the additional bit-trials; and adjust an operational mode conversion time by adjusting bit-trial delays based on the estimated conversion time and the estimated acquisition time.

In some aspects, this disclosure is directed to an asynchronous analog-to-digital converter (ADC) circuit for calibrating a conversion speed. The circuit comprises a digital-to-analog converter (DAC) circuit configured to sample an analog signal; and control circuitry configured to: at a time other than during an operational mode of the ADC circuit: perform a number of bit-trials of a conversion on the sampled analog signal; perform and count a number of additional bit-trials; estimate a conversion time and an acquisition time using the number of bit-trials and the number of the additional bit-trials; and means for adjusting an operational mode conversion time by adjusting bit-trial delays based on the estimated conversion time and the estimated acquisition time.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
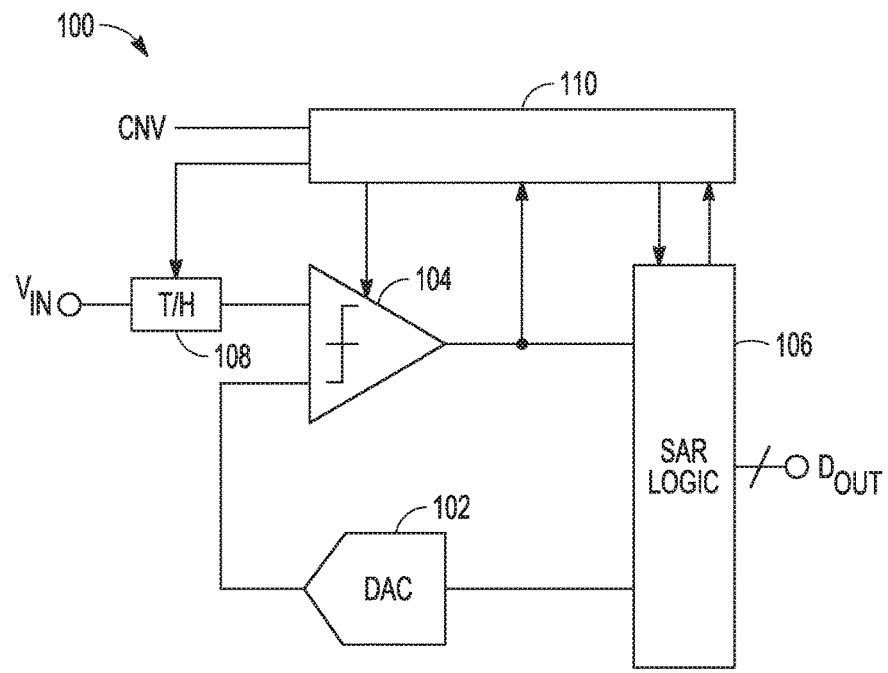
FIG. 1 is a block diagram of an example of an ADC circuit.

Many Internet-of-Things (IoT) applications utilize numerous sensor nodes, with each sensor node consuming power. Thus, for each sensor node, low power can be a key consideration in terms of power cost and battery life. However, the variation of Process (P), Voltage (V), and Temperature (T) (or "PVT" variation) can be a barrier to minimizing power consumption, especially in an ultra-low power (ULP) operation. For example, in a 40 nanometer (nm) ULP process and a 0.5V nominal supply, a circuit speed can vary between 100×-1000× over PVT. This means margin design may not work, and a need exists to calibrate every integrated circuit (IC) for their PVT.

Successive approximation register (SAR) ADCs are well known as power efficient ADCs that can provide a wide range of accuracy and speed. The speed of a SAR ADC can depend on its internal loop delay, including comparison time, digital-to-analog converter (DAC) settling time, logic delay, which can change over PVT. To maximize acquisition time and eliminate the need of a duty-controlled clock, a precision asynchronous SAR ADCs can detect an end of conversion (EOC) to move to an acquisition phase automatically. However, eliminating the duty-controlled clock makes an acquisition time undefined, which is used for the speed calibration on chip.

This disclosure describes, among other things, techniques to calibrate a conversion time of an ADC, e.g., of a successive approximation register (SAR) ADC. Using various techniques of this disclosure, a conversion time and an acquisition time of an ADC, e.g., SAR ADC, can be estimated so that a speed of the ADC can be calibrated. As described in detail below, an ADC circuit can perform M bit-trials in its conversion phase and continue performing additional bit-trials, e.g., in a calibration mode. The ADC can count the number of additional bit-trials performed, e.g., X bit-trials, that occur before the next conversion phase, where additional bit-trials can be considered to be the number of available bit-trials during an acquisition time if the ADC, e.g., SAR ADC, continues performing bit-trials instead of sampling an input signal. The ADC knows how many bit-trials are performed during the conversion phase, e.g., M bit-trials. Using techniques of this disclosure, the ADC can estimate the conversion time and the acquisition time using M and X. Then, the conversion time of the ADC can be calibrated by adjusting one or more of the comparison time, DAC settling delay, and logic propagation delay, where the conversion time is the sum of all comparison time, DAC settling delay, and logic propagation delay in a conversion. The conversion time is the sum of the bit trial delays.

An advantage of the techniques of this disclosure is improved accuracy due to the use of the SAR loop itself for performing the conversion time measurements for calibration. Another advantage is the use of minimal additional circuitry. For example, as described above, there is no need for replica circuit because the calibration mode and the operational mode of the ADC circuit do not operate in parallel. Rather, the existing circuitry of the ADC can be used to perform the calibration before or at a time other than the normal operational mode of the ADC, for example.

FIG. 1 is a block diagram of an example of an ADC circuit. The ADC circuit 100 of FIG. 1 is a SAR ADC, the operation of which being known to those of ordinary skill in the art. The SAR ADC circuit 100 can include a digital-to-analog converter (DAC) circuit 102, e.g., a switched capacitor array, a comparator circuit 104, and SAR logic control and computation circuitry 106. The SAR ADC circuit can further include a track-and-hold circuit 108 to store a portion of an analog input signal "Vin" during an acquisition phase and a clock generation circuit 110 to provide appropriate timing for the circuit 100. Signal "CNV" represents an external acquisition trigger. When "CNV" goes high, the ADC stops its acquisition, e.g., signal "ACQ" goes low, and the ADC begins conversion.

The SAR logic control circuitry 106 (also referred to as a "controller" or "control circuitry" in this disclosure) can control the operation of DAC 102, such as during the bit trials (charge balancing a reference charge stored on the bit trial capacitors of the DAC against a sampled charge of the input signal Vin). The SAR logic control and computation circuitry 106 initiates a sample of the input voltage Vin, initiates a first conversion of the sampled input voltage to a first set of bit values, such as using a first set of bit trials, and initiates a second conversion of a second sampled input voltage to a second set of bit values, such as using a second set of bit trials, and so forth.

The SAR logic control and computation circuitry 106 can include a state machine or other digital engine to perform functions such as progressing the ADC through different states of normal operation and to perform the calculations described. The SAR logic control and computation circuitry 106 can determine a final N-bit digital output value for the sampled input, and the final N-bit digital value can be made available as a digital output Dout. In addition, the SAR logic control and computation circuitry 106 can perform the calibration techniques described in this disclosure.

In some example implementations, the DAC circuit 102 shown in FIG. 1 can be a switched capacitor DAC that includes an array of capacitors. The DAC circuit 102 can include M weighted circuit components where M is equal to or greater than N, such as where the weight (e.g., capacitance value) of a particular weighted circuit component can be specified relative to that of one or more other weighted circuit components, with M being a positive integer. In certain examples, M is equal to sixteen and the weighted circuit components include sixteen capacitors (for example, with the sixteen capacitors including different multiples of a specified unit capacitor to obtain the weighting relative to each other).

A portion of the DAC circuit 102 can be a sampling DAC circuit 108. During a sampling phase, a clock generation circuit 110 can control operation of the track-and-hold circuit 108 to sample an analog input voltage Vin and hold it during a conversion phase.

Figure 2:
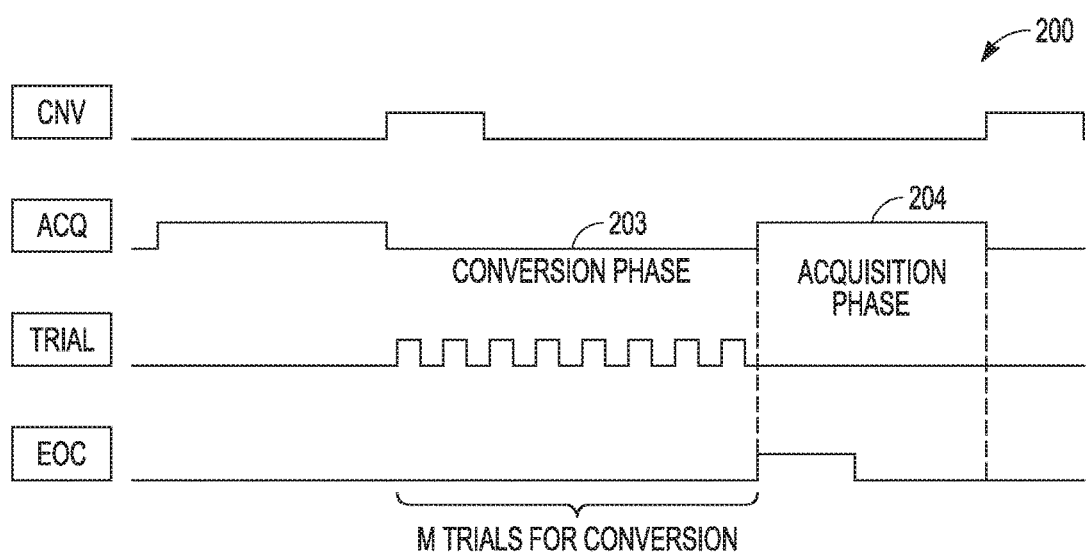
FIG. 2 is a timing diagram of an example of an asynchronous SAR ADC.

FIG. 2 is a timing diagram 200 of an example of an asynchronous SAR ADC. A SAR ADC generally has multiple bit-trials (a number M bit-trials) per conversion phase. Each bit-trial has a bit-trial delay that includes a DAC settling time, which can be fixed during the design of the ADC, and a comparison time, which has input dependency. The conversion time includes a number of bit-trial delays. For example, a conversion time for a DAC circuit having a resolution of 10 bits can include 10 or more bit-trial delays.

Signal "CNV" represents an external acquisition trigger. When "CNV" goes high, the ADC stops its acquisition, e.g., signal "ACQ" goes low, and the ADC moves to its conversion phase, as shown at 202. Signal "TRIAL" represents an internal comparator clock signal and, after a number M bit-trials, the end of conversion signal "EOC" goes high, which automatically moves the ADC operation into the next acquisition phase. If the length of the conversion phase 202 is not sufficient, referred to as the conversion time, it can cause DAC settling error. If the length of the acquisition phase 204 is not sufficient, referred to as the acquisition time, it can cause sampling error.

A conversion period of a SAR ADC can include a conversion time plus an acquisition time, where the acquisition time is for sampling input signal and the conversion time is for the internal operation to proceed with analog-to-digital conversion. As an example, if the SAR ADC operates at 1 MHz, the SAR conversion period is 1/1 MHz=1 microsecond. The SAR conversion time includes multiple 1) DAC settling delays, 2) comparison times, and 3) logic propagation delays.

This disclosure describes, among other things, techniques to calibrate a speed of an ADC, e.g., of a successive approximation register (SAR) ADC. Using various techniques of this disclosure, a conversion time and an acquisition time of an ADC, e.g., SAR ADC, can be estimated so that a speed of the ADC can be calibrated. As described in detail below, an ADC circuit can perform M bit-trials in its conversion phase and continue performing additional bit-trials, e.g., in a calibration mode. The ADC can count the number of additional bit-trials, e.g., X bit-trials, performed in the acquisition phase that occur before the next conversion phase. The ADC knows how many bit-trials are performed during the conversion phase, e.g., M bit-trials. Using techniques of this disclosure, the ADC circuit, e.g., the SAR logic and control circuit 106 of FIG. 1, can estimate the conversion time and the acquisition time using M and X. Then, the speed of the ADC can be calibrated by adjusting one or more of the conversion time, DAC settling delay, comparison time, and logic propagation delay.

Figure 3:
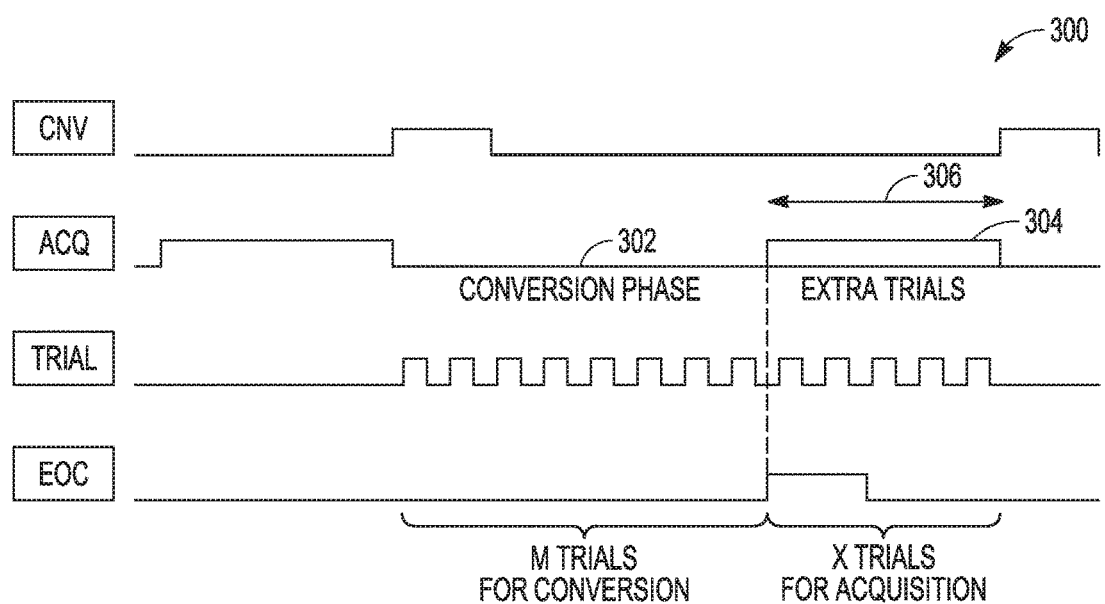
FIG. 3 is a timing diagram of an example of an asynchronous SAR ADC in a calibration mode using various techniques of this disclosure.

FIG. 3 is a timing diagram 300 of an example of an asynchronous SAR ADC in a calibration mode using various techniques of this disclosure. Signal "CNV" represents an external acquisition trigger. When signal "CNV" changes its logic level, e.g., goes high, the ADC stops its acquisition, e.g., signal "ACQ" goes low, and the ADC moves to its conversion phase, as shown at 302. Signal "TRIAL" represents an internal comparator clock signal and, after a number M bit-trials, the end of conversion signal "EOC" goes high. The number M can be at least equal to or greater than a resolution of a DAC circuit of the ADC. For example, for a 10-bit ADC, M can be ten (10) or more bit-trials.

In accordance with this disclosure, at the end of the conversion phase 304, e.g., when signal "EOC" changes its logic level, such as when it goes high, the ADC can begin counting a number X of additional bit-trials. The ADC can continue counting the number of additional bit-trials that occur within the acquisition time, as shown at 306, and can stop when signal "CNV" changes its logic level, e.g., goes high, which marks the end of the acquisition phase.

For simplicity, assume that all bit-trials take the same amount of time. Then, the estimated conversion time and the estimated acquisition time are, respectively, as follows:

$$Tcnv=Tper*M/(M+X) \quad (1)$$

$$Tacq=Tper*X/(M+X) \quad (2)$$

where Tcnv, Tacq, Tper represent the conversion time, the acquisition time, and sampling period, respectively, and M is the number of bit trials.

Using the estimated conversion time Tcnv and the estimated acquisition time Tacq, the SAR logic circuit, e.g., circuit 106 of FIG. 1, can calibrate the conversion time and the acquisition time of the ADC by adjusting bit-trial delay. As described below with respect to FIGS. 4-6, the SAR logic circuit, e.g., circuit 106 and a clock generation circuit 110 of FIG. 1, can adjust bit-trial delay using several techniques, such as by adjusting a comparison time (e.g., using load capacitance) of a comparator circuit, by adjusting a delay (e.g., using load capacitance) of a delay circuit, and by adjusting a characteristic of a logic circuit propagation delay, e.g., by adjusting supply voltage and/or bias voltage to optimize speed, power and leakage current.

The calibration process can be iteratively repeated until X reaches a target range or threshold. In some example implementations, the target X can be defined by simulation.

Figure 4:
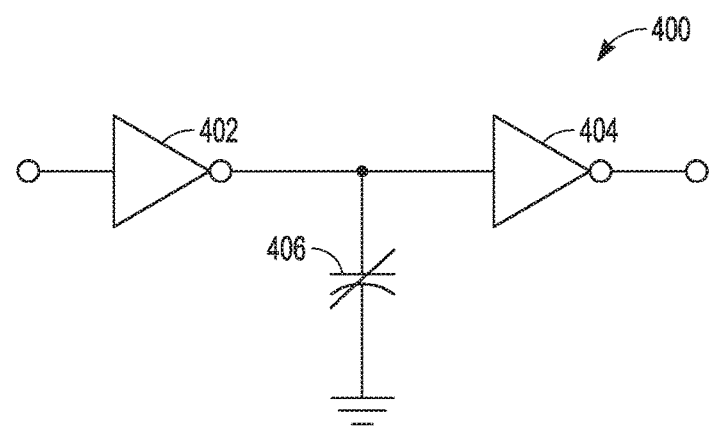
FIG. 4 is a portion of a delay circuit of a clock generation circuit of FIG. 1.

FIG. 4 is a portion of a delay circuit of the clock generation circuit of FIG. 1. The delay circuit 400 can include a first inverter 402 coupled to a second inverter 404 and a variable capacitor 406 coupled between the output of the first inverter 402 and input of the second inverter 404. The capacitor 406 can determine the width of the negative pulse of the "trial" signal, e.g., of FIGS. 3 and 8, which can be used for the DAC settling time. By adjusting a characteristic of the delay circuit, as described below with respect to FIG. 6, the bit-trial delay can be adjusted, which can adjust the conversion time of the operational mode. For example, the SAR logic circuit, e.g., circuit 106 of FIG. 1, can adjust a capacitance of the capacitor 406 of the delay circuit 400 to adjust the operational mode conversion time.

Figure 5:
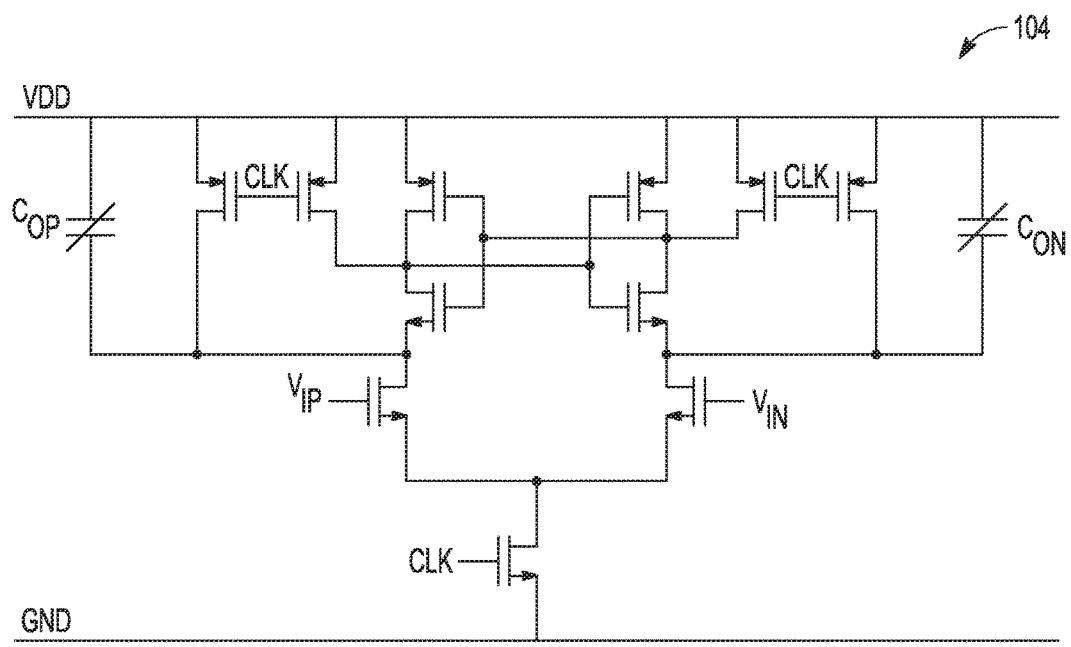
FIG. 5 is a schematic diagram of a comparator circuit of FIG. 1.

FIG. 5 is a schematic diagram of the comparator circuit 104 of FIG. 1. The comparator circuit 104 can include, among other things, one or more loading capacitors, which are shown in FIG. 5 as variable capacitor $C_{OP}$ and variable capacitor $C_{ON}$. The capacitive elements $C_{OP}$ and $C_{ON}$ can determine the comparison time of the comparator circuit 104. By adjusting a characteristic of the comparator circuit 104, the bit-trial delay can be adjusted, which can adjust the conversion time of the operational mode. For example, the SAR logic circuit, e.g., circuit 106 of FIG. 1, can adjust a capacitance of the capacitive elements $C_{OP}$ and $C_{ON}$ to adjust the comparison time of the comparator circuit, which can adjust the operational mode conversion time.

It should be noted that the adjusting a capacitance of the capacitors $C_{OP}$ and $C_{ON}$ can also adjust a noise level of the comparator circuit 104. For example, by increasing the capacitance of the capacitive elements $C_{OP}$ and $C_{ON}$, the comparator circuit 104 can take more time to finish the bit-trial comparisons and can suppress a noise of the comparator circuit 104.

Figure 6:
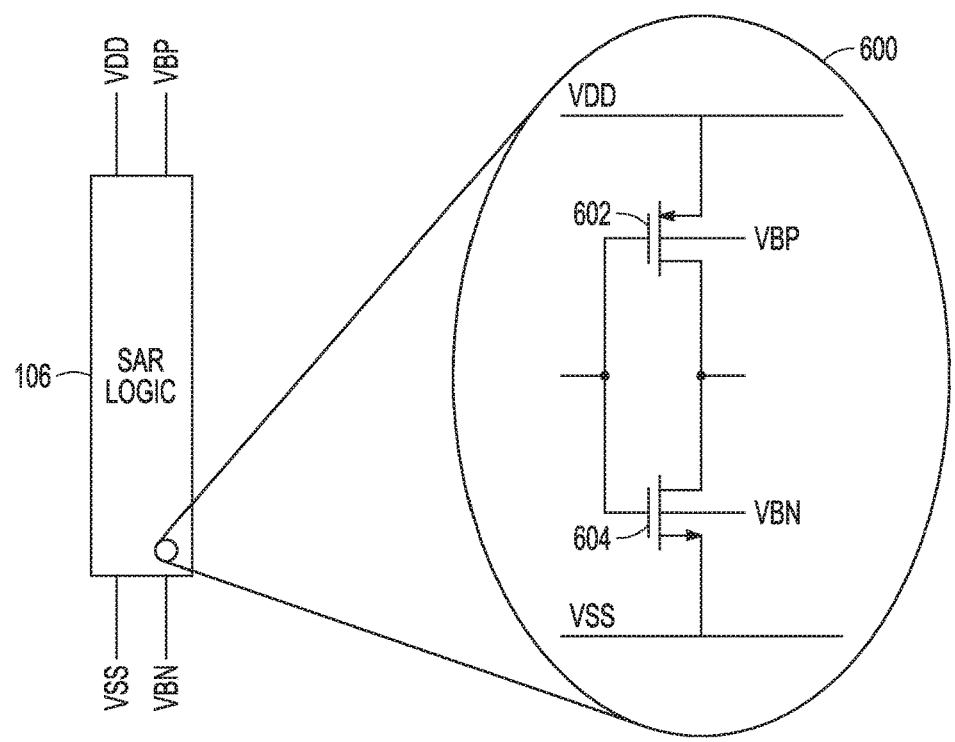
FIG. 6 depicts a portion of the SAR logic circuit of FIG. 1.

FIG. 6 depicts a portion of the SAR logic circuit of FIG. 1. The SAR logic circuit 600 can include p-channel and n-channel transistors 602 and 604 coupled to power supply voltages $V_{DD}$ and $V_{SS}$ and back-bias voltages $V_{BP}$ and $V_{BN}$. A logic circuit propagation delay of logic circuit 600 can be tuned using these voltages. By adjusting a characteristic of the logic circuit 600, the bit-trial delay can be adjusted, which can adjust the conversion time of the operational mode. For example, the SAR logic circuit, e.g., circuit 106 of FIG. 1, can adjust a power supply voltage, e.g., one of voltages $V_{DD}$ and $V_{SS}$, or a back-bias voltage, e.g., one of voltages $V_{BP}$ and $V_{NP}$, to adjust the logic circuit propagation delay and thus the operational mode conversion time.

Decreasing a power supply voltage, such as by decreasing voltage $V_{DD}$, can increase the logic propagation delay and decrease logic speed. Increasing a power supply voltage, such as by increasing voltage $V_{DD}$, can decrease the logic propagation delay and increase logic speed. However, increasing a power supply voltage can increase power consumption.

Decreasing voltage $V_{BP}$ and increasing $V_{BN}$ can decrease the logic propagation delay and increase logic speed. However, such an adjustment can increase leakage current.

Figure 7:
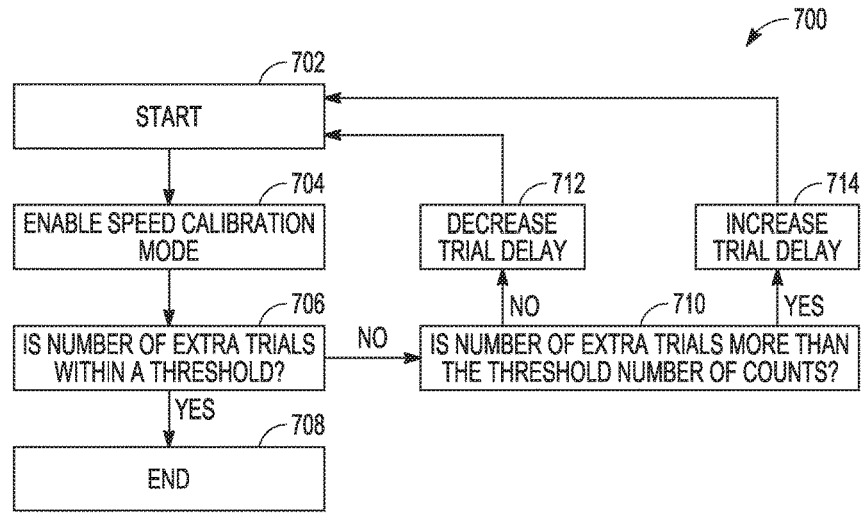
FIG. 7 is a flow diagram depicting an example of a method of calibrating an ADC circuit.

FIG. 7 is a flow diagram depicting an example of a method 700 of calibrating an ADC circuit. The method 700 can start at block 702 and enter a speed calibration mode at block 704, e.g., upon receipt of a calibration signal. In the calibration mode, the ADC circuit can count a number X of additional bit-trials. At block 706, the SAR logic circuit 106 (of FIG. 1) can determine whether the number X of additional bit-trials is within a threshold number of counts. In some examples, the threshold number of counts can be a range or window, e.g., 6-8 counts. In other example implementations, the threshold number can be a single value, e.g., 6 counts, rather than a range or window.

If the number X of additional bit-trials is within a threshold number of counts ("YES" branch of block 706), then the calibration can end at block 708 and the ADC can exit its calibration mode and enter an operational mode. If the number X of additional bit-trials is not within a threshold number of counts ("NO" branch of block 706), then, at block 710, the SAR logic circuit 106 (of FIG. 1) can determine whether the number of additional bit-trials is more or less than the threshold number of counts.

If the number X of additional bit-trials is less than the threshold number of counts ("NO" branch of block 710), then the SAR logic circuit 106 (of FIG. 1) can decrease the bit-trial delay at block 712. For example, the bit-trial delay can be decreased by adjusting one or more of the comparison time, DAC settling delay, and logic propagation delay, as described above. After decreasing the bit-trial delay, the process can return to block 702 to continue the iterative calibration routine.

In some optional example implementations, it can be desirable to increase the bit-trial delay, e.g., to suppress a noise of a comparator circuit. If the number X of additional bit-trials is more than the threshold number of counts ("YES" branch of block 710), then the SAR logic circuit 106 (of FIG. 1) can optionally increase the bit-trial delay at block 714. For example, the bit-trial delay can be increased by adjusting one or more of the comparison time, DAC settling delay, and logic propagation delay, as described above. After increasing the bit-trial delay, the process can return to block 702 to continue the iterative calibration routine.

Figure 8:
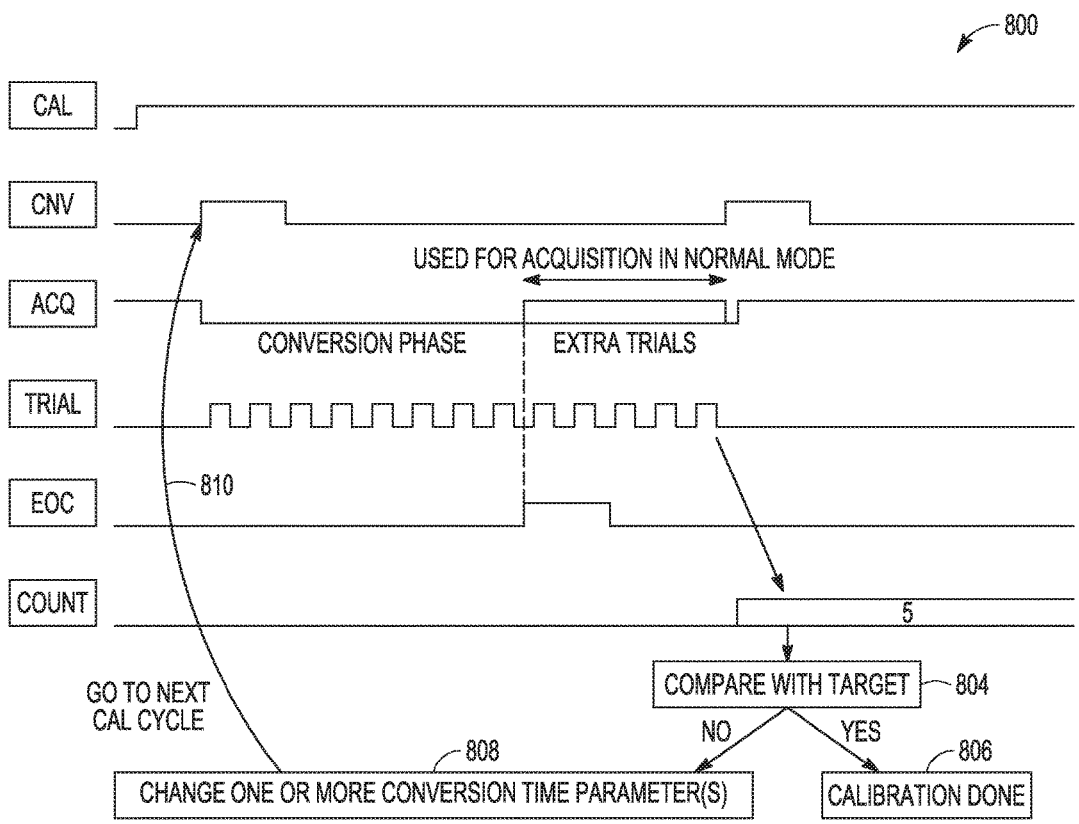
FIG. 8 is another timing diagram of an example of an asynchronous SAR ADC using various techniques of this disclosure.

FIG. 8 is another timing diagram 800 of an example of an asynchronous SAR ADC using various techniques of this disclosure. FIG. 8 is a more detailed version of FIG. 3 and includes the signals shown in FIG. 3 and further includes a signal "CAL" that represents a calibration mode signal that can take the ADC out of an operational mode and into a calibration mode.

Figure 9:
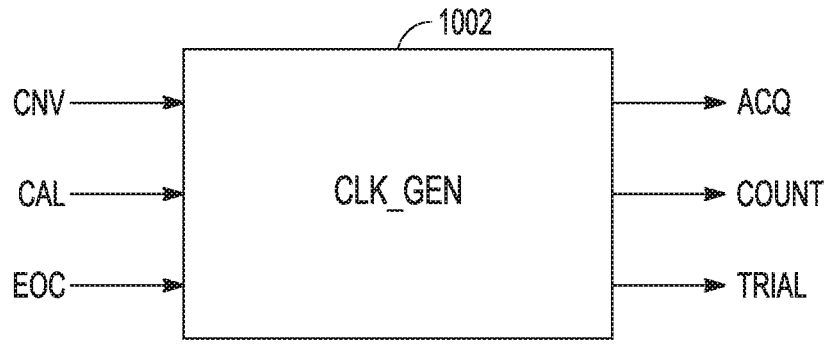
FIG. 9 is a diagram of a clock generation circuit of FIG. 1 that can be used to implement various techniques of this disclosure.

When the signal "CNV" goes high, a counter, e.g., an output signal of clock generation circuit 110 of FIGS. 1 and 9, can stop counting the additional bit-trials at 802 and update "COUNT" to compare with the threshold 804 to proceed calibration operation. In the non-limiting example shown in FIG. 8, the count is five (5) additional bit-trials.

Reference number 804 of FIG. 8 corresponds with reference number 706 of FIG. 7, reference number 806 corresponds with reference number 708, reference number 808 corresponds with reference numbers 710, 712, and 714, and reference number 810 corresponds with reference number 702.

As described above, e.g., with respect to the flow chart of FIG. 7, the SAR logic circuit 106 (of FIG. 1) can compare the number of additional bit-trials to a threshold at 804. If the number of additional bit-trials is within a threshold number of counts, then the calibration can end at 806. The signal "CAL" can go low and the ADC can exit its calibration mode and enter a normal operational mode.

However, if the number of additional bit-trials is not within a threshold number of counts, then the SAR logic circuit 106 (of FIG. 1) can adjust, e.g., increase or decrease, one or more of the comparison time, DAC settling delay, and logic propagation delay, at 808, as described above. After adjusting the bit-trial delay, the process can return to the next calibration cycle, e.g., as depicted at 810, to continue the iterative calibration routine.

The calibration process can be iteratively repeated until the number of additional bit-trials reaches a target range or threshold. That is, during the calibration mode, the calibration process can perform the regular bit trials and the additional bit trials and count the number of trials. Then, the control circuitry can adjust the bit-trial delays, e.g., increase or decrease the bit-trial delays, perform the bit trials and count the number again until the number of additional trials reaches a threshold. For example, if the count is 5, as in FIG. 8, and the threshold is 4, the process can be repeated until the count is reduced to 4. In some example implementations, the target X can be defined by simulation.

FIG. 9 is a diagram of a clock generation circuit 110 of FIG. 1 that can be used to implement various techniques of this disclosure. In accordance with this disclosure, the clock generation circuit 110 can include an input to receive a signal "CAL" and an output to generate a signal "COUNT". In addition, the clock generation circuit 110 can include inputs for acquisition trigger signal "CNV" and end of conversion signal "EOC" to move to an acquisition phase automatically, and outputs for the acquisition signal "ACQ" and signal "TRIAL" that represents an internal comparator clock signal.

Figure 10:
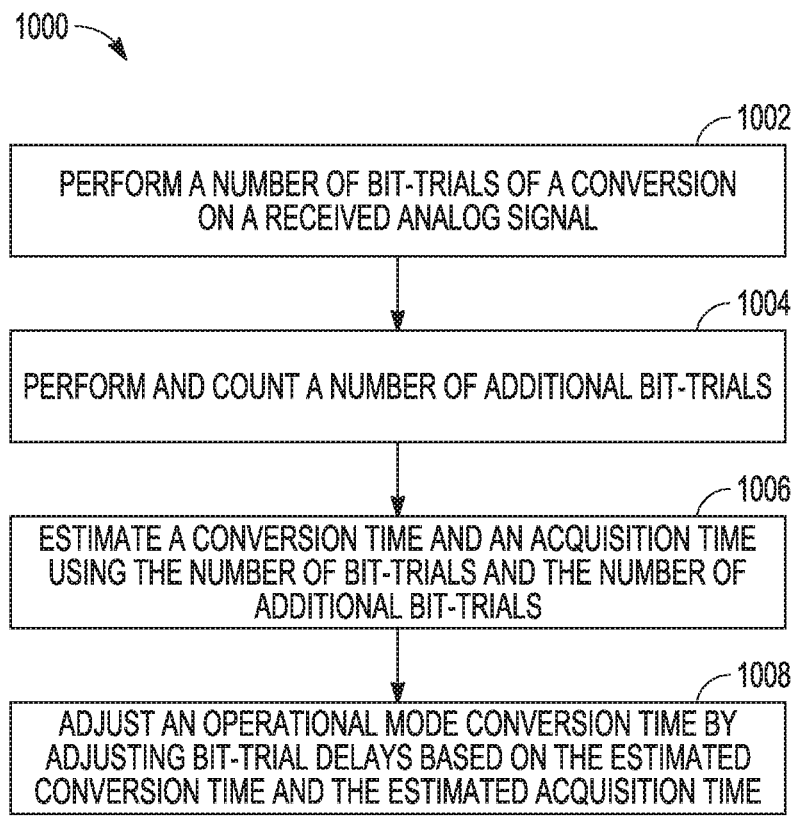
FIG. 10 is a flow diagram depicting an example of a method of calibrating an ADC circuit.

FIG. 10 is a flow diagram depicting an example of a method 1000 of calibrating an ADC circuit. At block 1002, at a time other than during an operational mode of the ADC circuit, an ADC circuit, e.g., ADC circuit 106 of FIG. 1, can perform a number of bit-trials of a conversion on a received analog signal. At block 1004, the ADC circuit, e.g., control circuitry 106 of FIG. 1, can perform and count a number of additional bit-trials, e.g., using a counter.

At block 1006, the ADC circuit, e.g., control circuitry 106 of FIG. 1, can estimate a conversion time and an acquisition time using the number of bit-trials and the number of the additional bit-trials. At block 1008, the ADC circuit, e.g., control circuitry 106 of FIG. 1, can adjust an operational mode conversion time by adjusting bit-trial delays based on the estimated conversion time and the estimated acquisition time. For example, the control circuitry 106 of FIG. 1 can adjust one or more of the comparison time, DAC settling delay, and logic propagation delay.

Figure 11:
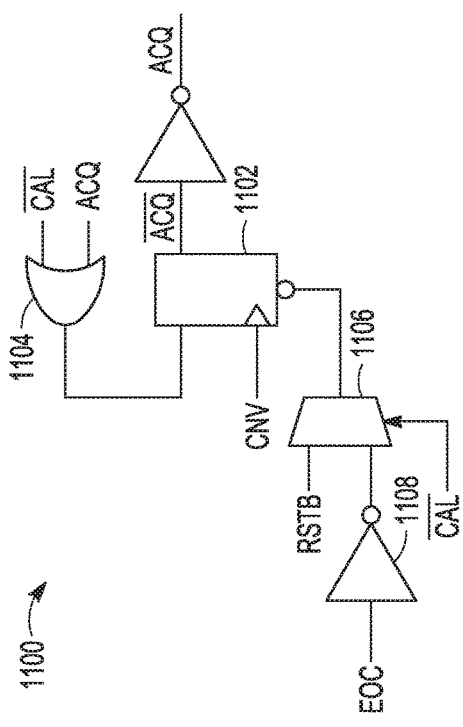
FIG. 11 is a schematic diagram of an example of an acquisition signal generator circuit that can be used to implement various techniques of this disclosure.

FIG. 11 is a schematic diagram of an example of an acquisition signal generator circuit 1100 that can be used to implement various techniques of this disclosure. The acquisition signal generator circuit 1100 is a portion of the clock generation circuit 110, e.g., of FIG. 1.

The acquisition signal generator circuit 1100 in FIG. 11 can include a flip-flop circuit 1102 configured to receive the conversion signal "CNV" and the output of OR gate 1104. The OR gate 1104 outputs a signal using the acquisition signal "ACQ" as a first input and an inverted calibration mode signal "CAL_BAR" as a second input. When the inverted calibration mode signal "CAL_BAR" is low, it sets the clock generation circuit in a calibration operation mode and when it is high, it sets the clock generation circuit in a normal operation mode. The inverted calibration mode signal "CAL_BAR" can come from a global ADC controller, for example.

The multiplexer 1106 can input a first input to receive a reset signal "rstb", e.g., from a global ADC controller, and a second input to receive an inverted version of an end of conversion signal "EOC" from inverter 1108. The multiplexer can be controlled by the inverted calibration mode signal "CAL_BAR".

Figure 12:
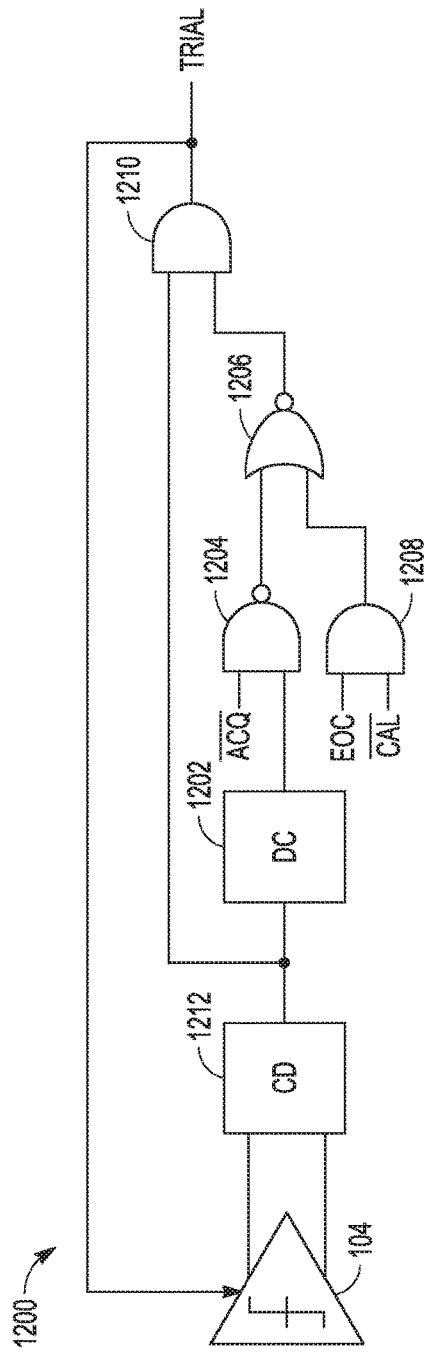
FIG. 12 is a schematic diagram of an example of a trial signal generator circuit in a clock generation circuit that can be used to implement various techniques of this disclosure.

FIG. 12 is a schematic diagram of an example of a trial signal generator circuit 1200 in the clock generation circuit 110 of FIG. 1 that can be used to implement various techniques of this disclosure. The trial signal generator circuit 1200 can include a completion detector ("CD") circuit 1212 coupled to the comparator 104 of FIG. 1. The CD circuit 1212 can detect when the comparator 104 finishes its comparison operation and, upon detection, output a logic high signal, for example. A delay circuit ("DC") 1202 can receive the output of the CD circuit and is used to adjust the DAC settling time. A portion of the delay circuit 1202 is shown in FIG. 4.

A NAND gate 1204 can receive the output of the delay circuit 1202 and inverted acquisition signal "ACQ_BAR". A NOR gate 1206 can receive the output of the NAND gate 1204 and, unlike conventional clock generation circuits, receive an output of an AND gate 1208. The AND gate 1208 outputs a signal based on an end of conversion signal "EOC" and the inverted calibration mode signal "CAL_BAR".

An AND gate 1210 receives the output of NOR gate 1206 and the output of CD circuit 1212 and outputs a bit-trial signal, e.g., "TRIAL" signal of FIG. 3 and FIG. 8.

VARIOUS NOTES

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A method of calibrating a conversion speed of an asynchronous analog-to-digital converter (ADC) circuit, the method comprising:
    at a time other than during an operational mode of the ADC circuit:
    performing a number of bit-trials of a conversion on a received analog signal;
    performing a number of additional bit-trials;
    estimating a conversion time and an acquisition time using the number of bit-trials and the number of the additional bit-trials; and
    adjusting an operational mode conversion time by adjusting bit-trial delays based on the estimated conversion time and the estimated acquisition time.

2. The method of claim 1, wherein adjusting the operational mode conversion time includes:
    adjusting a comparison time of a comparator circuit.

3. The method of claim 2, wherein adjusting the comparison time of the comparator circuit includes:
    adjusting a capacitance of the comparator circuit.

4. The method of claim 1, wherein adjusting the operational mode conversion time includes:
    adjusting a delay of a delay circuit.

5. The method of claim 4, wherein adjusting the delay of the delay circuit includes:
    adjusting a capacitance of the delay circuit.

6. The method of claim 1, wherein adjusting the operational mode conversion time includes:
adjusting a logic circuit propagation delay.

7. The method of claim 1, further comprising:
comparing the number of additional bit-trials to a threshold; and
to increase the conversion speed, decreasing the bit-trial delays when the number of additional bit-trials is less than the threshold.

8. The method of claim 1, further comprising:
comparing the number of additional bit-trials to a threshold; and
to decrease the conversion speed, increasing the bit-trial delays when the number of additional bit-trials is greater than the threshold.

9. The method of claim 1, further comprising:
iteratively repeating performing the number of bit-trials, performing and counting the number of additional bit-trials, the estimating, and adjusting until the number of additional bit-trials reaches a threshold.

10. The method of claim 1, further comprising:
enabling a calibration mode that operates at a time other than a normal ADC operational mode.

11. The method of claim 1, wherein performing a number of bit-trials includes:
performing successive approximation register (SAR) bit-trials.

12. An asynchronous analog-to-digital converter (ADC) circuit for calibrating a conversion speed, the circuit comprising:
a digital-to-analog converter circuit (DAC) configured to sample an analog signal; and
control circuitry coupled to the DAC, the control circuitry to:
at a time other than during an operational mode of the ADC circuit:
control the DAC to perform a number of bit-trials of a conversion on the sampled analog signal;
control the DAC to perform a number of additional bit-trials;
estimate a conversion time and an acquisition time using the number of bit-trials and the number of the additional bit-trials; and
adjust an operational mode conversion time by adjusting bit-trial delays based on the estimated conversion time and the estimated acquisition time.

13. The circuit of claim 12, further comprising:
a comparator circuit, wherein the control circuitry configured to adjust the operational mode conversion time is configured to adjust a comparison time of the comparator circuit.

14. The circuit of claim 13, wherein the control circuitry configured to adjust the operational mode conversion time is configured to adjust a capacitance of the comparator circuit.

15. The circuit of claim 12, further comprising:
a delay circuit, wherein the control circuitry configured to adjust the operational mode conversion time is configured to adjusting a delay of the delay circuit.

16. The circuit of claim 15, wherein the control circuitry configured to adjust the delay of the delay circuit is configured to adjust a capacitance of the delay circuit.

17. The circuit of claim 12, wherein the control circuitry includes a logic circuit, and wherein the control circuitry configured to adjust the operational mode conversion time is configured to adjust a characteristic of the logic circuit.

18. The circuit of claim 12, wherein the control circuitry is further configured to:
iteratively repeat performing the number of bit-trials, performing and counting the number of additional bit-trials, the estimating, and adjusting until the number of additional bit-trials reaches a threshold.

19. An asynchronous analog-to-digital converter (ADC) circuit for calibrating a conversion speed, the circuit comprising:
a digital-to-analog converter circuit (DAC) configured to sample an analog signal; and
control circuitry coupled to the DAC, the control circuitry to:
at a time other than during an operational mode of the ADC circuit:
control the DAC to perform a number of bit-trials of a conversion on the sampled analog signal;
control the DAC to perform a number of additional bit-trials; and
estimate a conversion time and an acquisition time using the number of bit-trials and the number of the additional bit-trials; and
means for adjusting an operational mode conversion time by adjusting bit-trial delays based on the estimated conversion time and the estimated acquisition time.

20. The circuit of claim 19, wherein the control circuitry includes successive approximation register (SAR) control circuitry.

* * * * *